(12) United States Patent
Li

(10) Patent No.: US 11,972,959 B2
(45) Date of Patent: Apr. 30, 2024

(54) APPARATUS FOR FILLING WAFER WITH GLASS POWDER

(71) Applicant: SHANDONG CAIJU ELECTRONIC TECHNOLOGY CO. LTD, Zibo (CN)

(72) Inventor: Xiangdong Li, Zibo (CN)

(73) Assignee: SHANDONG CAIJU ELECTRONIC TECHNOLOGY CO. LTD, Zibo (CN)

( * ) Notice: Subject to any disclaimer, the term of this patent is extended or adjusted under 35 U.S.C. 154(b) by 495 days.

(21) Appl. No.: 17/429,339

(22) PCT Filed: Feb. 14, 2020

(86) PCT No.: PCT/CN2020/075300
§ 371 (c)(1),
(2) Date: Aug. 8, 2021

(87) PCT Pub. No.: WO2020/164595
PCT Pub. Date: Aug. 20, 2020

(65) Prior Publication Data
US 2022/0013378 A1    Jan. 13, 2022

(30) Foreign Application Priority Data
Feb. 15, 2019  (CN) .......................... 201910117921.9

(51) Int. Cl.
*H01L 21/67*  (2006.01)
*B65G 53/24*  (2006.01)
*H01L 21/687*  (2006.01)

(52) U.S. Cl.
CPC ........ *H01L 21/67126* (2013.01); *B65G 53/24* (2013.01); *H01L 21/68707* (2013.01)

(58) Field of Classification Search
CPC ......... H01L 21/67126; H01L 21/67766; H01L 21/67778; H01L 21/6715; H05K 3/1233;
(Continued)

(56) References Cited

U.S. PATENT DOCUMENTS 6,101,937 A * 8/2000 Murakami ........... H05K 3/1233
118/301
9,084,385 B2 * 7/2015 Miyahara ........... H05K 13/0895

FOREIGN PATENT DOCUMENTS

CN     205588759 U    9/2016
CN     109712919 A    5/2019
(Continued)

*Primary Examiner* — Donghai D Nguyen
(74) *Attorney, Agent, or Firm* — Bayramoglu Law Offices LLC

(57) ABSTRACT

An apparatus for filling a wafer with glass powder includes a supporting device for supporting a wafer, a feeding device and a scraping device, where the feeding device and the scraping device are both provided on an upper side of the supporting device; a lower side of the feeding device is provided with a fetching part, and the feeding device drives the fetching part to move; a lower side of the scraping device is provided with a scraper, and the scraping device drives the scraper to move. After the feeding device evenly applies the glass powder to the wafer through the fetching part, the scraping device removes an excess of the glass powder on the wafer through the scraper to ensure an appropriate amount of glass powder on the wafer, avoiding complex subsequent processing due to excessive glass powder, and avoiding uneven glass powder distribution.

9 Claims, 16 Drawing Sheets

(58) Field of Classification Search
CPC .............. H05K 13/0895; Y10T 29/532; Y10T 29/5304
See application file for complete search history.

(56) References Cited

FOREIGN PATENT DOCUMENTS

| | | |
|---|---|---|
| JP | 2005175353 A | 6/2005 |
| JP | 2008030998 A | 2/2008 |

* cited by examiner

A

APPARATUS FOR FILLING WAFER WITH GLASS POWDER

CROSS REFERENCE TO THE RELATED APPLICATIONS

This application is the national phase entry of International Application No. PCT/CN2020/075300, filed on Feb. 14, 2020, which is based upon and claims priority to Chinese Patent Application No. 201910117921.9, filed on Feb. 15, 2019, the entire contents of which are incorporated herein by reference.

TECHNICAL FIELD

The present disclosure pertains to the technical field of electronic component production equipment, and specifically relates to an apparatus for filling a wafer with glass powder.

BACKGROUND

A wafer refers to a round silicon wafer used for the fabrication of silicon semiconductor integrated circuits. Various circuit element structures can be fabricated on the silicon wafer to obtain integrated circuit products with specific electrical functions. In the production process of an electronic component using a wafer, glass powder needs to be applied to the wafer to ensure that a glass protective layer can be formed on the side part of the chip after dicing.

At present, glass powder is typically applied to the wafer through a manual procedure, where the glass powder is manually mixed with water and then applied to the wafer. This method has a slow speed during application, which not only affects the production speed but also results in a high production cost. Moreover, the quality of glass powder application depends on the operability of the operator, but the manual application has poor stability, which easily results in defective electronic components, thereby increasing the production cost.

SUMMARY

Technical Problem

In order to overcome the shortcomings of the prior art, the present disclosure provides an apparatus for filling a wafer with glass powder. The present disclosure can automatically and stably apply the glass powder to the wafer.

Solution to the Problem

Technical Solution

In order to solve the technical problem, the present disclosure adopts the following technical solution. An apparatus for filling a wafer with glass powder includes a supporting device for supporting a wafer, a feeding device and a scraping device, where the feeding device and the scraping device are both provided on an upper side of the supporting device; a lower side of the feeding device is provided with a fetching part, and the feeding device drives the fetching part to move; a lower side of the scraping device is provided with a scraper and drives the scraper to move.

Preferably, the fetching part may include a fetching tube, a suction rod and a fetching cylinder; one end of the suction rod extends into the fetching tube; the suction rod and the fetching tube may be slidably and hermetically connected; the fetching tube may be mounted on the feeding device; the fetching cylinder may be mounted on the feeding device; the fetching cylinder may be connected to the suction rod and may drive the suction rod to move axially.

Preferably, the fetching tube may be provided vertically; an outer diameter of a lower end of the fetching tube may be smaller than an outer diameter of a central part of the fetching tube, and a suction part may be formed at the lower end of the fetching tube.

Preferably, the feeding device may include a feeding translation device and a feeding lifting device; the feeding lifting device may be mounted on the feeding translation device; the fetching part may be provided on the feeding lifting device.

Preferably, the scraper may be mounted on the scraping device through a scraper holder; an upper part of the scraper may be slidably connected to the scraper holder; a buffer spring may be provided between the scraper and the scraper holder.

Preferably, a scraper clamp may be fixed on an upper side of the scraper; mounting pins may be symmetrically provided at two ends of the scraper clamp; two sides of the scraper holder may be respectively provided with mounting slots matched with the mounting pins on the corresponding sides; an upper part of the scraper clamp may be slidably provided in the scraper holder; the buffer spring may be provided between the scraper clamp and the scraper holder.

Preferably, two sides of the scraper clamp may be both spaced apart from the scraper holder.

Preferably, one side of the scraper may be provided with a V-shaped knife; the opening of the V-shaped knife may face upward; the V-shaped knife may be perpendicular to the scraper.

Preferably, the supporting device may include a feeding supporting device and a scraping supporting device; the feeding device may be provided on an upper side of the feeding supporting device; the scraping device may be provided on a lower side of the scraping supporting device.

Preferably, the feeding supporting device may include a tray and a feeding rotating motor; the tray may be provided horizontally; the feeding rotating motor may be connected to the tray and may drive the tray to rotate; an upper side of the tray may be provided with a plurality of suction troughs; the suction troughs may be connected to a vacuum device.

Preferably, the feeding supporting device further may include a feeding tray lifting cylinder; the tray may include a ring-shaped fixed part and a lifting part provided coaxially with the fixed part; a piston rod of the feeding tray lifting cylinder may be provided on a lower side of the lifting part; the piston rod of the feeding tray lifting cylinder may be connected to the lifting part and may drive the lifting part to lift.

Beneficial Effects of the Disclosure

Beneficial Effects

Compared with the prior art, the present disclosure has the following beneficial effects:
1. After the feeding device evenly applies the glass powder to the wafer through the fetching part, the scraping device removes an excess of the glass powder on the wafer through the scraper to ensure an appropriate amount of glass powder on the wafer, avoiding complex subsequent processing due to excessive glass powder, and avoiding uneven glass powder distribution. The present disclosure achieves fast and stable glass powder application, which improves the yield of the electronic component and reduces the production cost.

2. The fetching cylinder drives the fetching rod to move axially, so as to suck the glass powder into the fetching tube and transfer the glass powder in the fetching tube to the wafer evenly. It is convenient to fetch the glass powder, and easy to control the amount of the glass powder, so as to avoid the glass powder being applied too much.

3. The lower end of the fetching tube is provided with a fetching part, which is convenient for sucking the glass powder and accurately applying the glass powder to the wafer.

4. The feeding lifting device drives the suction part to lift, and the feeding translation device drives the feeding lifting device to move, so as to facilitate the fetching part to flexibly transfer the glass powder to the wafer.

5. A buffer spring is provided between the scraper and the scraper holder, which ensures that the scraper is directly attached to the wafer reliably to scrape off the excess of the glass powder on the wafer without causing the scraper to damage the wafer.

6. The buffer spring is provided between the scraper clamp and the scraper holder, which makes the scraper easy to disassemble and assemble. The mounting pins at the two ends of the scraper clamp are matched with the mounting slots on the corresponding sides to realize the guiding of the scraper.

7. The two sides of the scraper clamp are both spaced apart from the scraper holder, such that the scraper is at an acute angle with the wafer when scraping the glass powder on the wafer, thereby avoiding the scraper damaging the wafer when it is perpendicular to the wafer and ensuring that the excess glass powder is scraped off.

8. The V-shaped knife and the scraper cooperate to remove the glued glass powder on the scraper and concentrate the removed glass powder in the center, which facilitates the recycling of the removed glass powder and reduces the production cost.

9. The feeding supporting device cooperates with the feeding device to evenly apply the glass powder to the wafer, and the scraping device and the scraping supporting device cooperate to scrape off the excess glass powder on the wafer. The scraping device and the feeding device do not interfere with each other, which improves the work efficiency.

10. There are multiple suction troughs on the tray, which can firmly suck the wafer and ensure the flatness of the wafer, so as to facilitate the even distribution of the glass powder on the wafer. The tray is connected to a feeding rotating motor that drives the tray to rotate, thereby rotating the wafer, such that the glass powder is evenly distributed on the wafer under the action of a centrifugal force.

11. The feeding tray lifting cylinder is connected to the lifting part and drives the lifting part to lift, which facilitates the picking and placing of the wafer, and also facilitates the tray to cooperate with a manipulator to transfer the wafer automatically.

BRIEF DESCRIPTION OF THE DRAWINGS

Description of the Drawings

Figure 1:
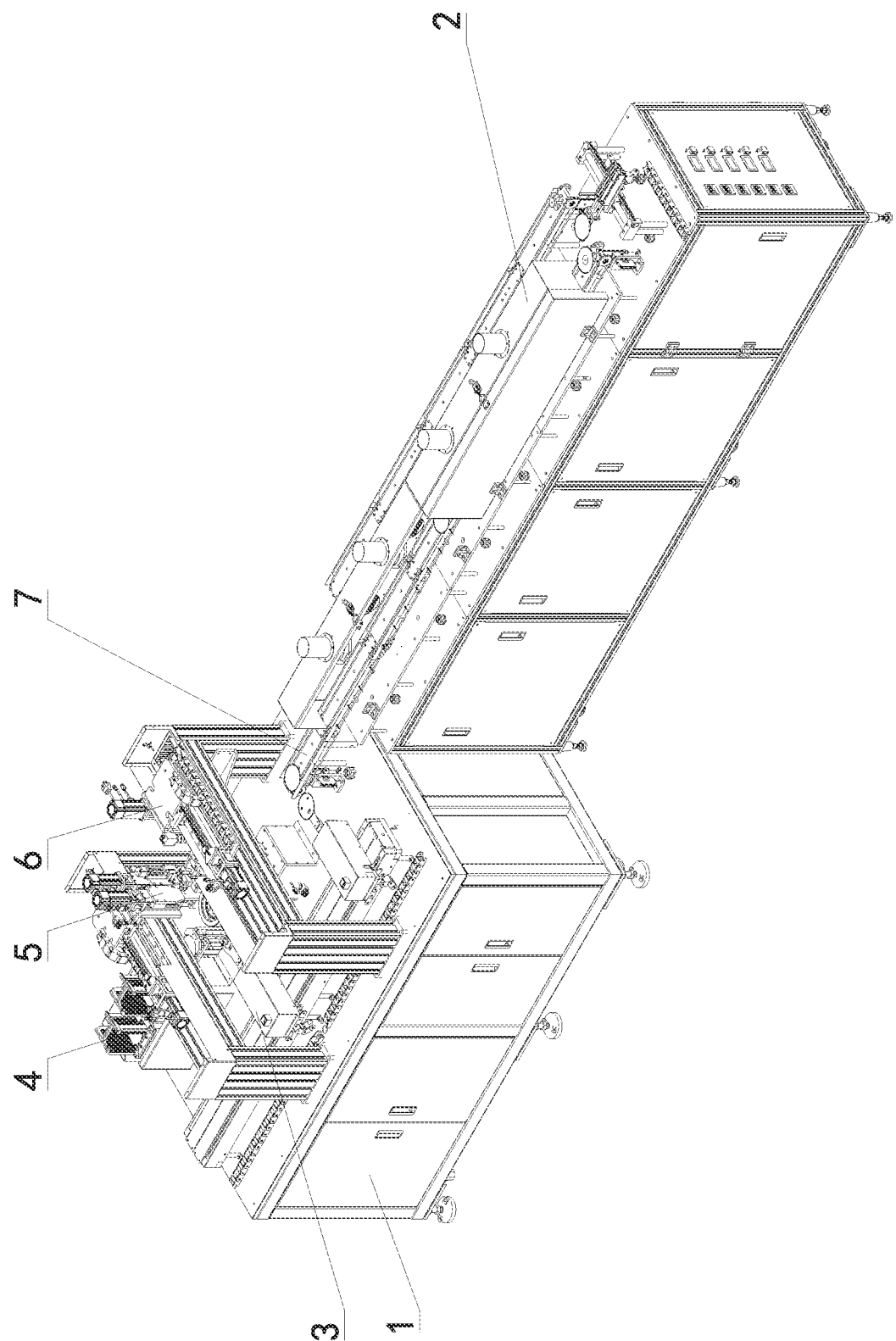

FIG. 1 is a stereoscopic view of an apparatus for filling a wafer with glass powder.

Figure 2:
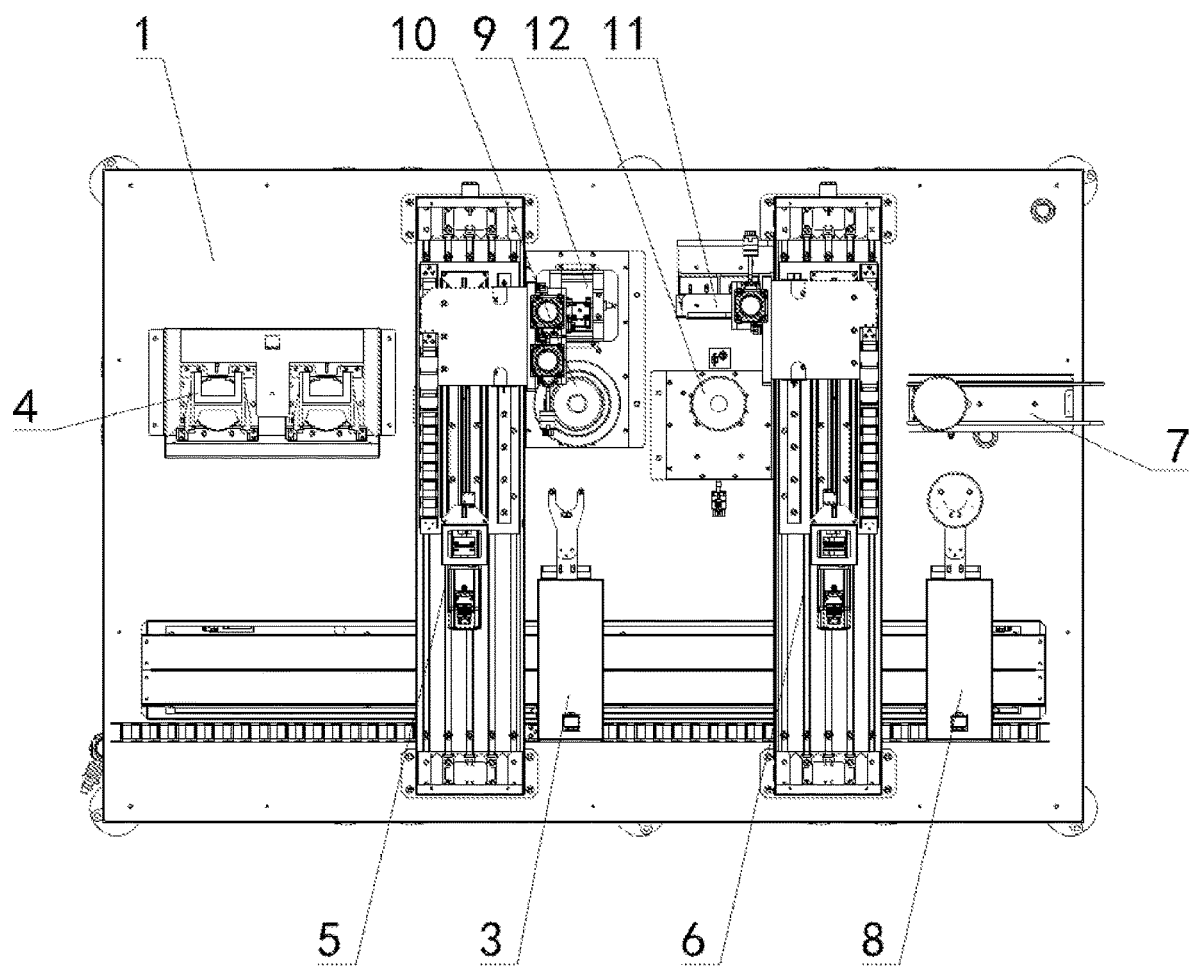

FIG. 2 is a top view of an apparatus for filling a wafer with glass powder.

Figure 3:
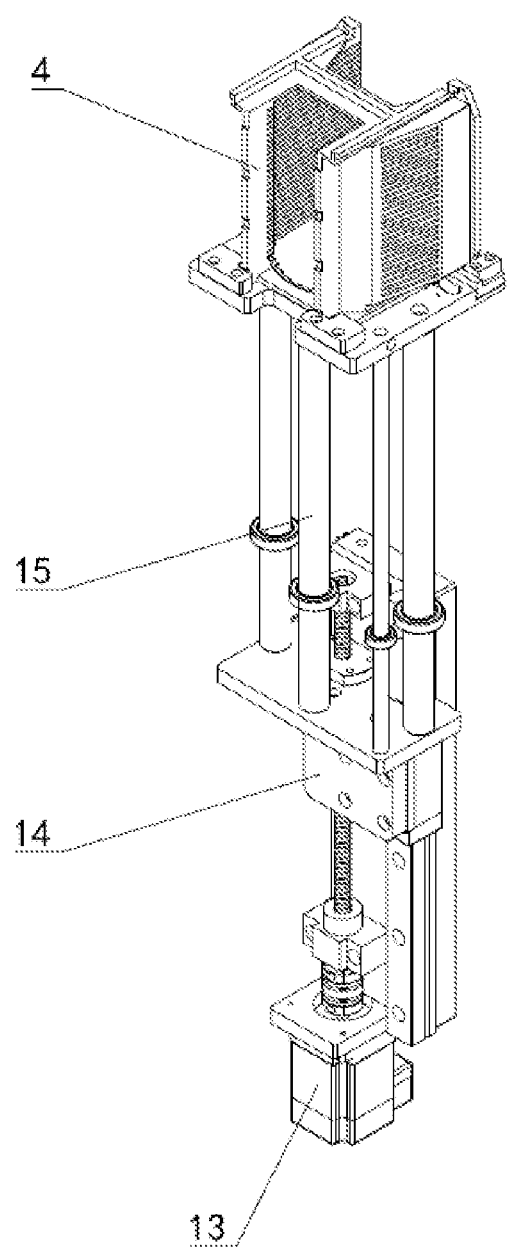

FIG. 3 is a stereoscopic view of a wafer cassette lifting device.

Figure 4:
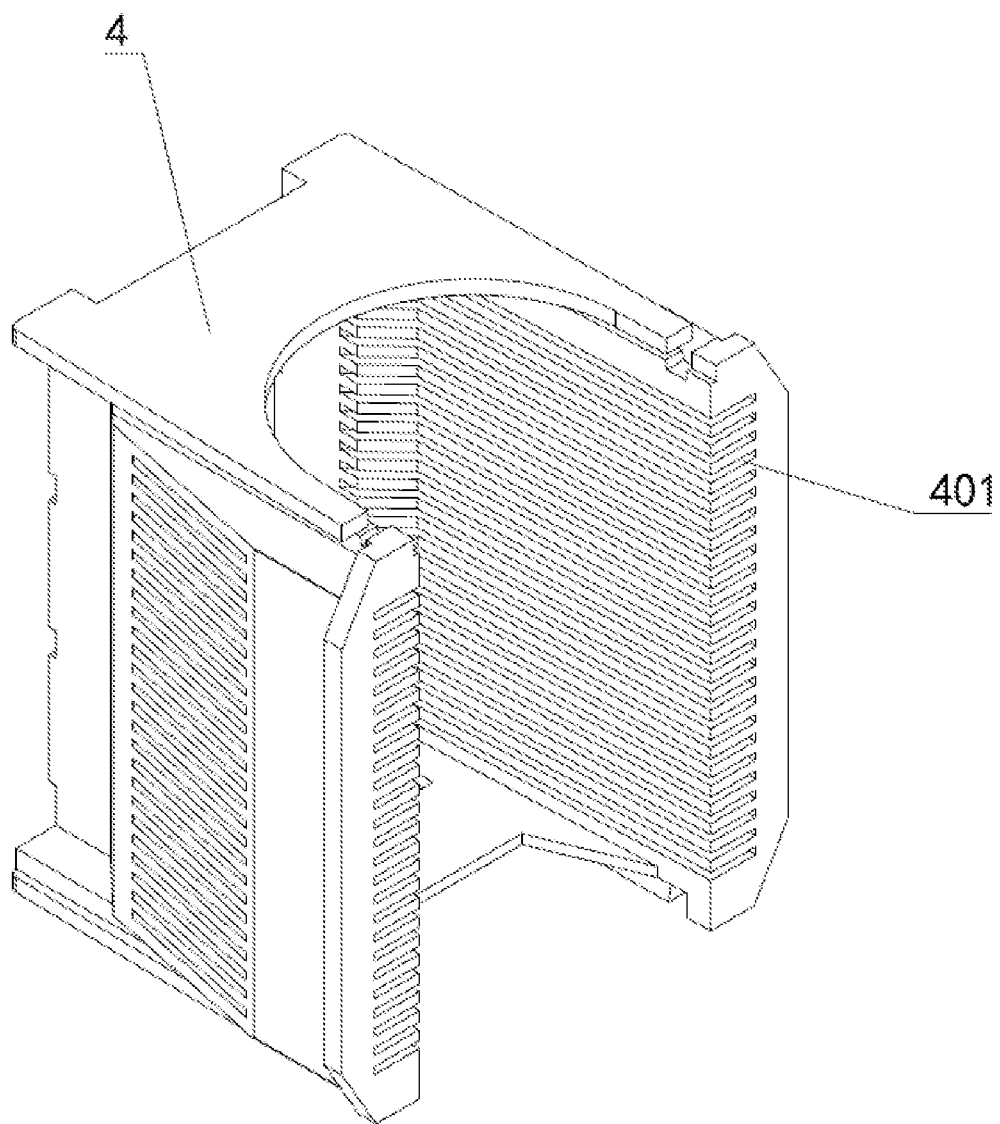

FIG. 4 is a stereoscopic view of a wafer cassette.

Figure 5:
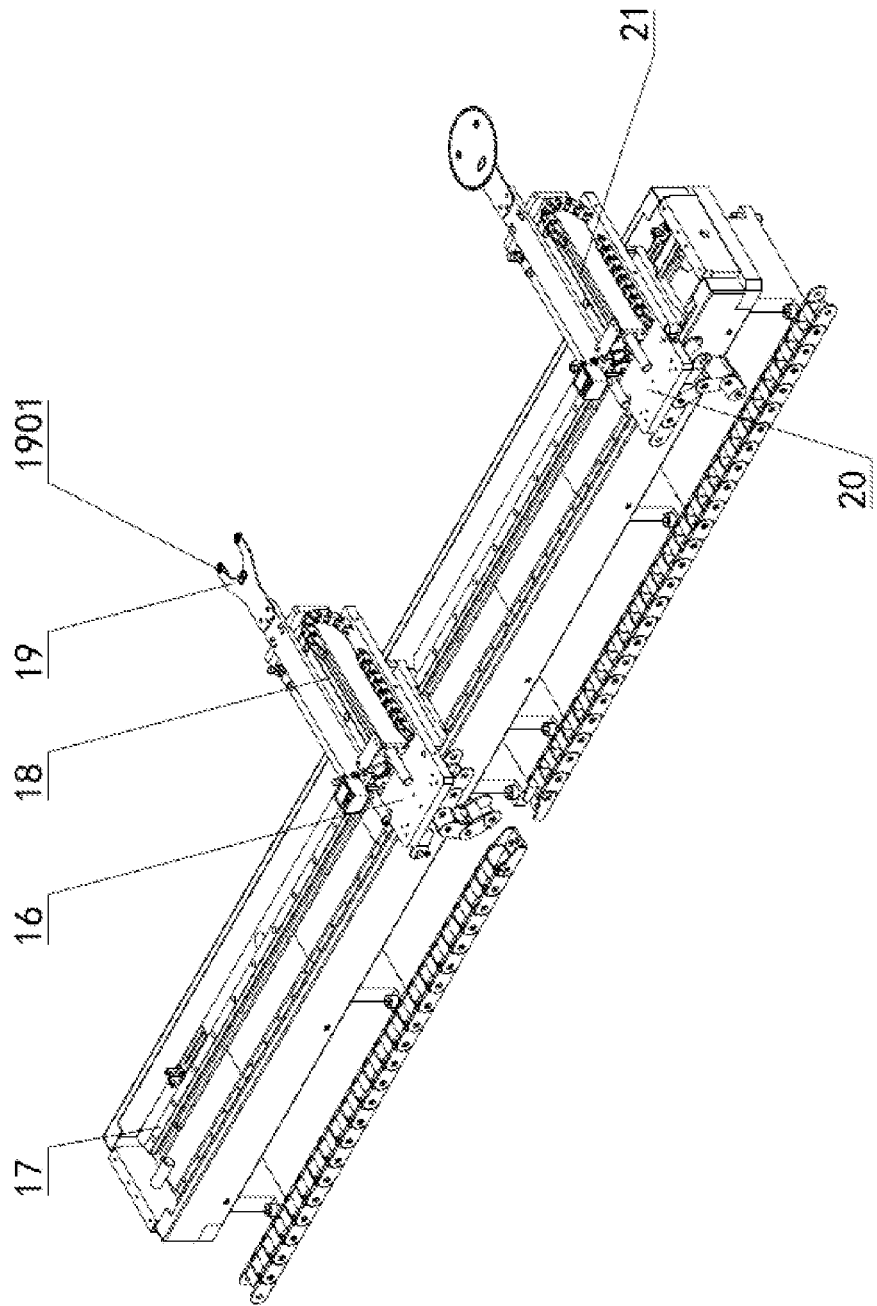

FIG. 5 is a stereoscopic view of a feeding manipulator and a discharging manipulator.

Figure 6:
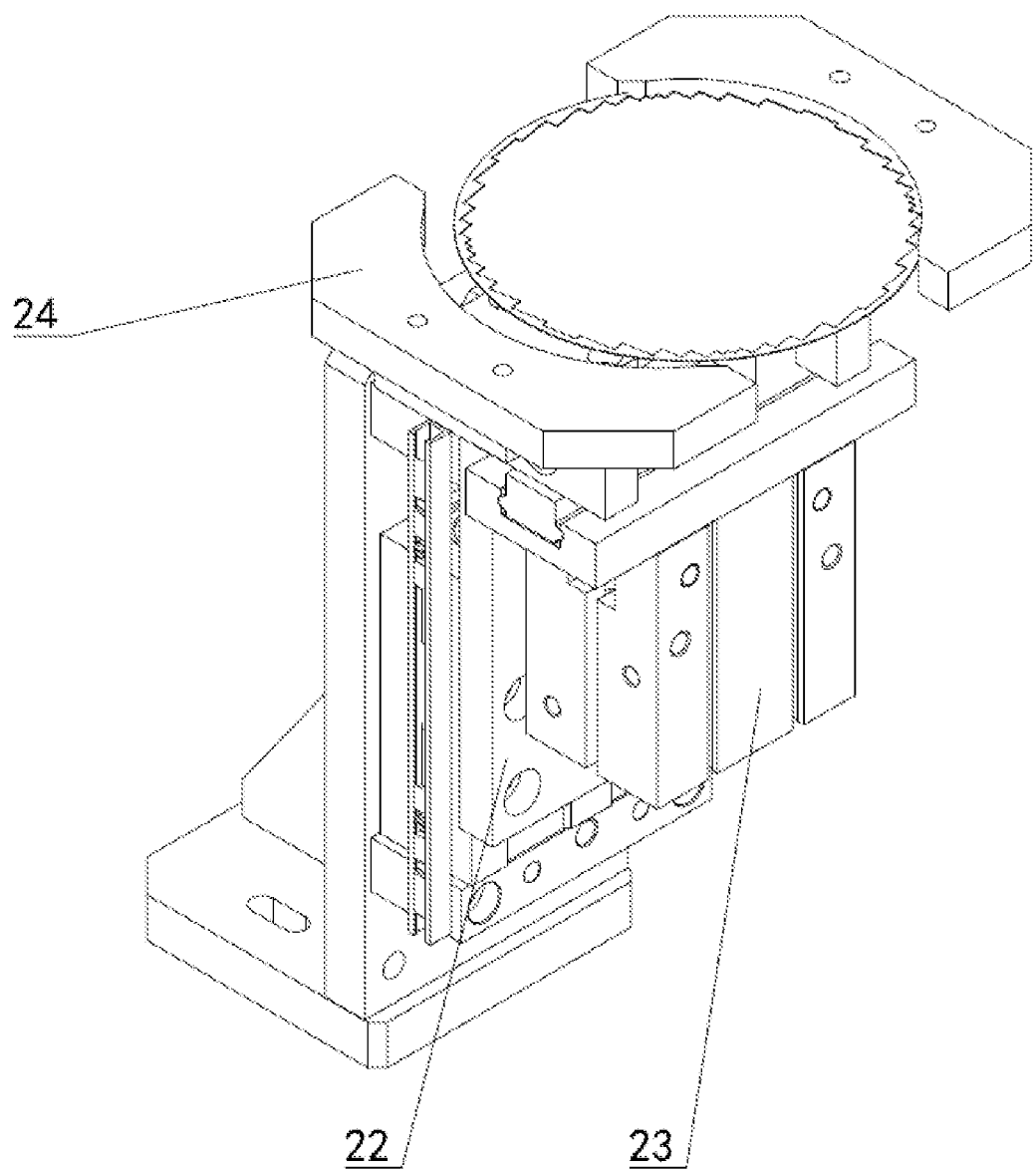

FIG. 6 is a stereoscopic view of a centering mechanism.

Figure 7:
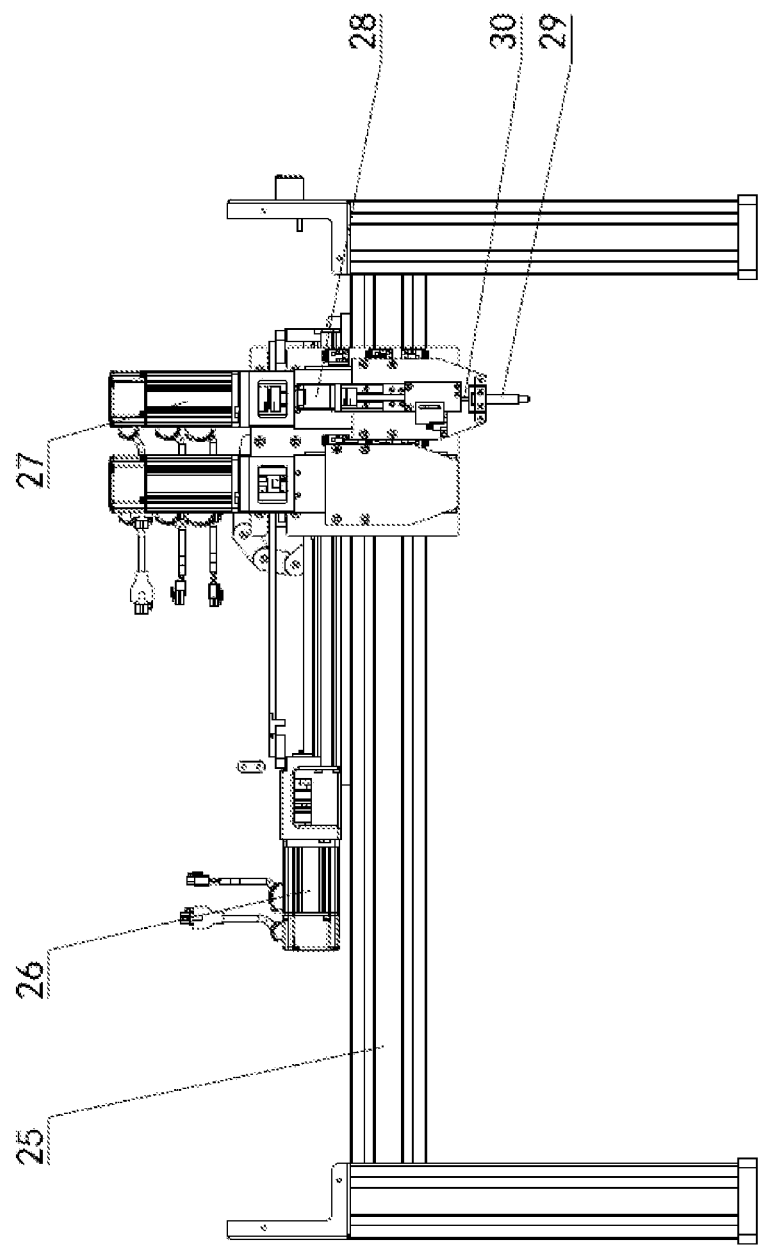

FIG. 7 is a front view of a feeding device.

Figure 8:
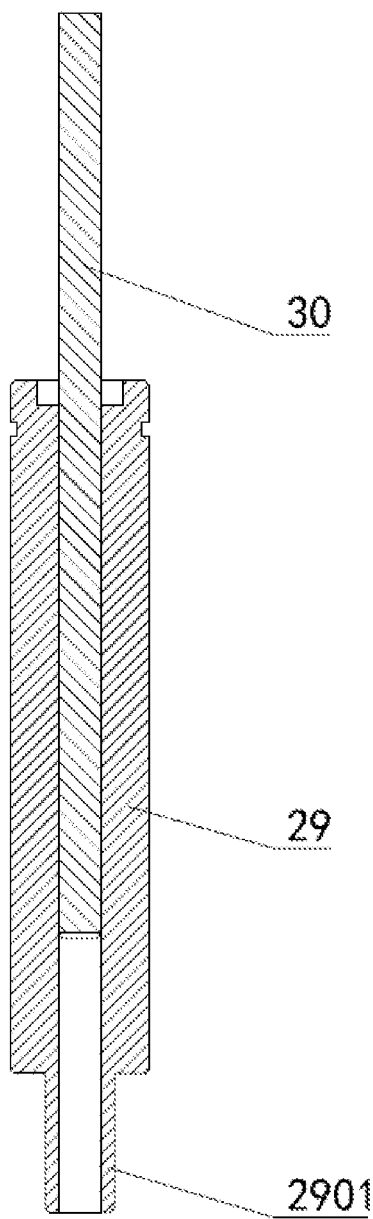

FIG. 8 is a front view of a fetching tube in cooperation with a suction rod.

Figure 9:
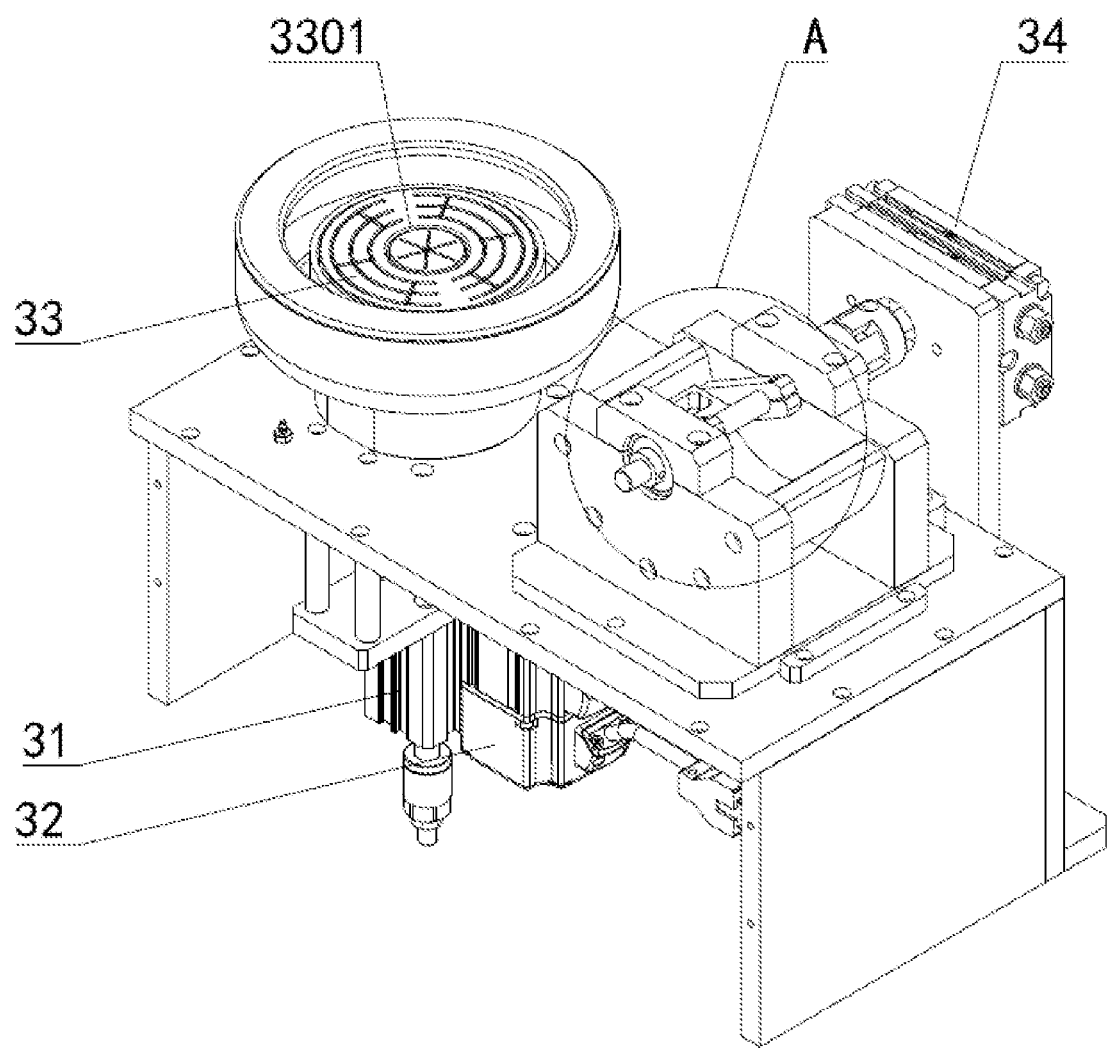

FIG. 9 is a stereoscopic of glass powder stirring device and a feeding supporting device.

Figure 10:
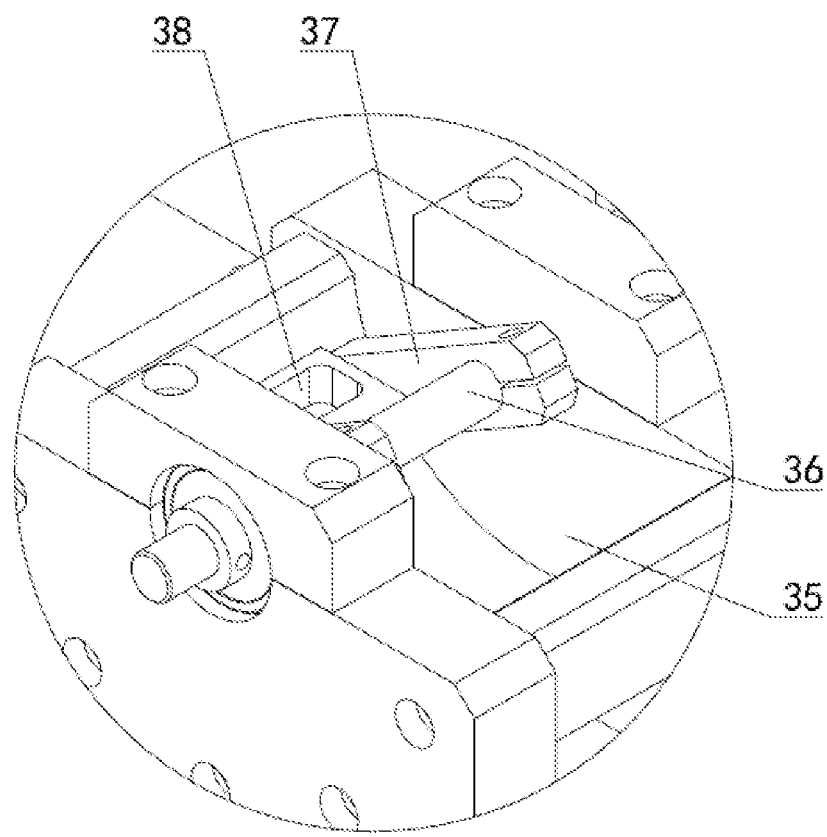

FIG. 10 is a detail of A in FIG. 9.

Figure 11:
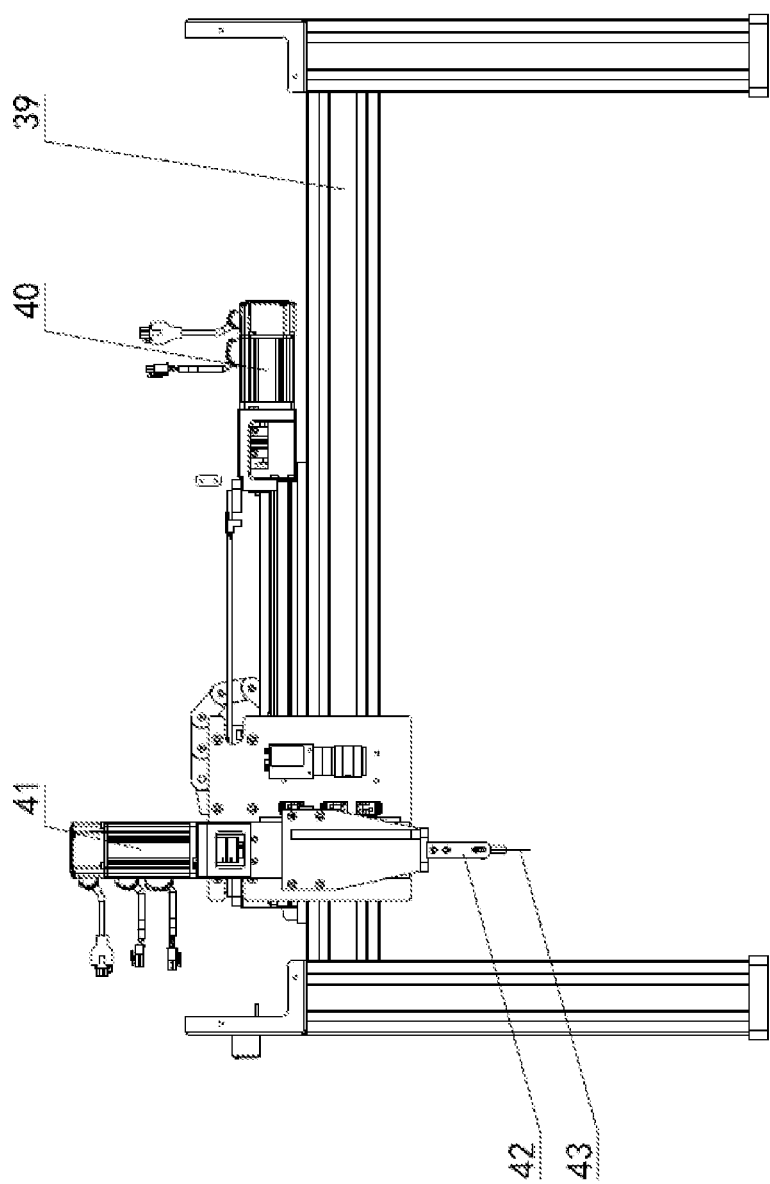

FIG. 11 is a front view of a scraping device.

Figure 12:
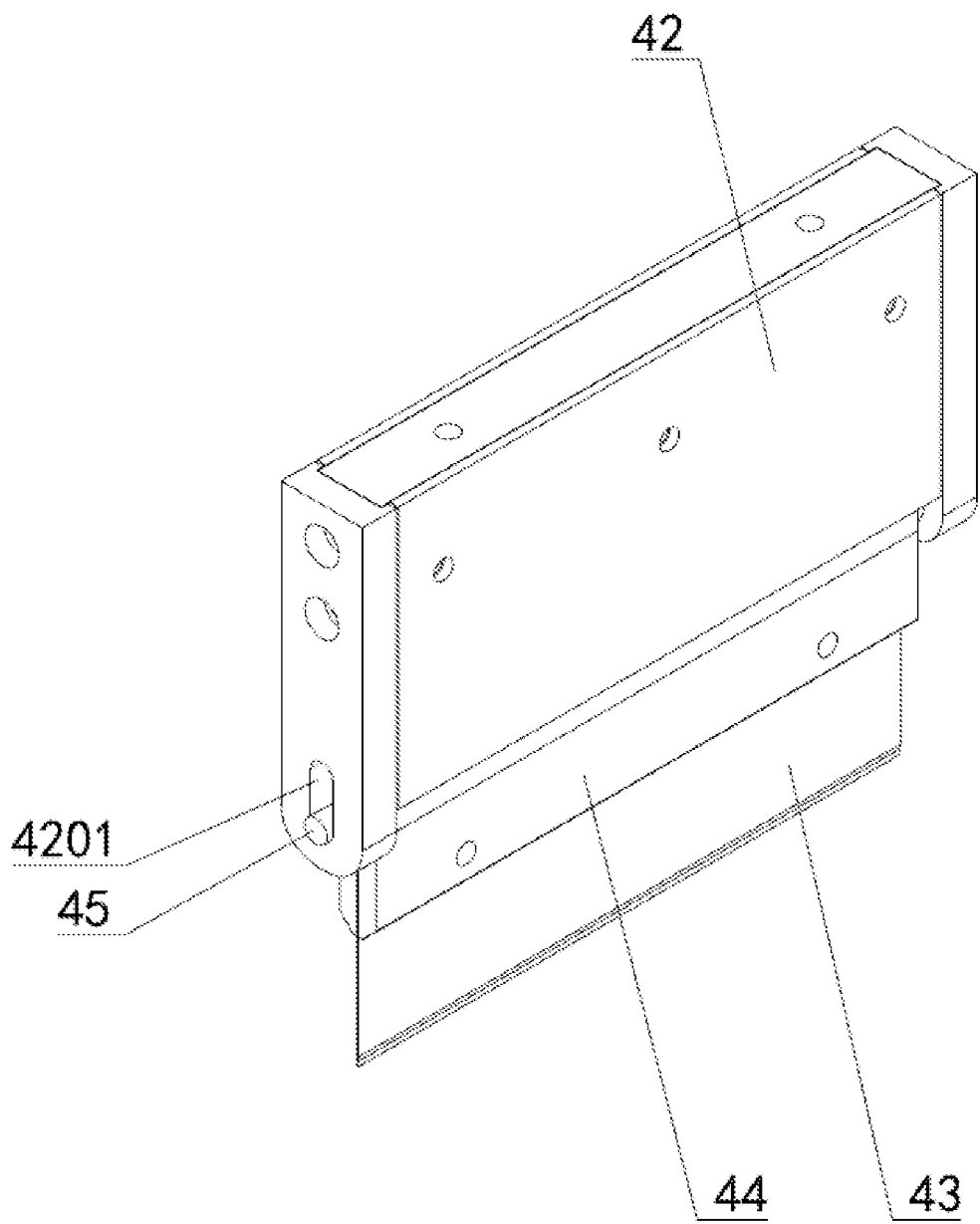

FIG. 12 is a stereoscopic view of a scraper and a scraper holder.

Figure 13:
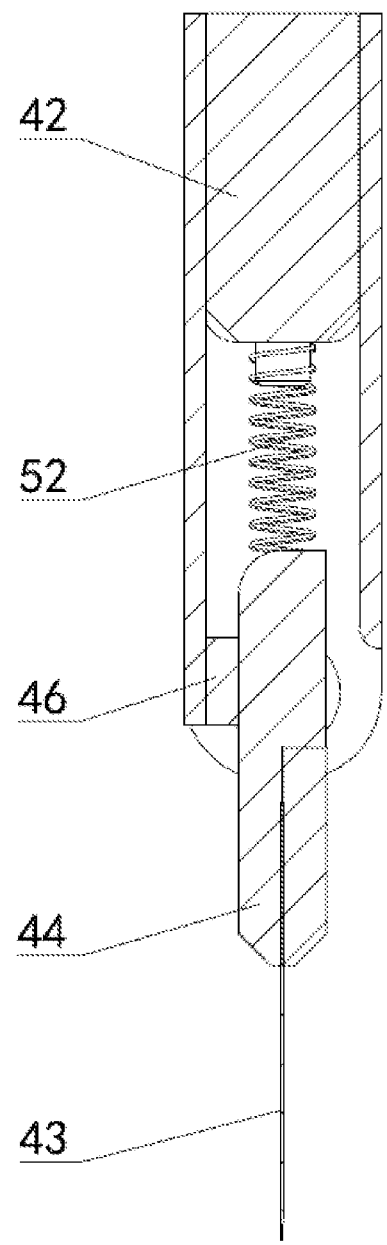

FIG. 13 is a left view of the scraper and the scraper holder in cooperation.

Figure 14:
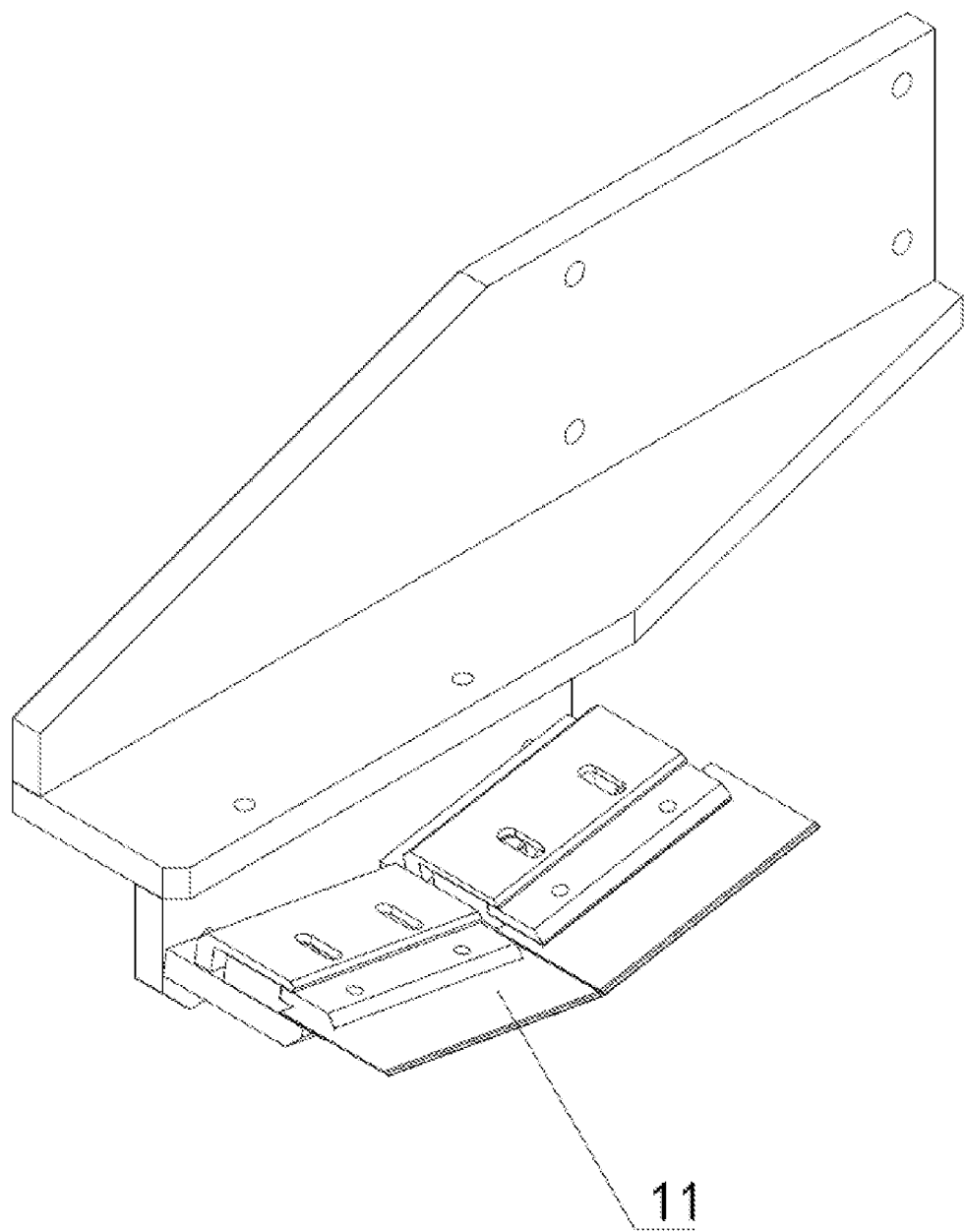

FIG. 14 is an assembly drawing of a V-shaped knife.

Figure 15:
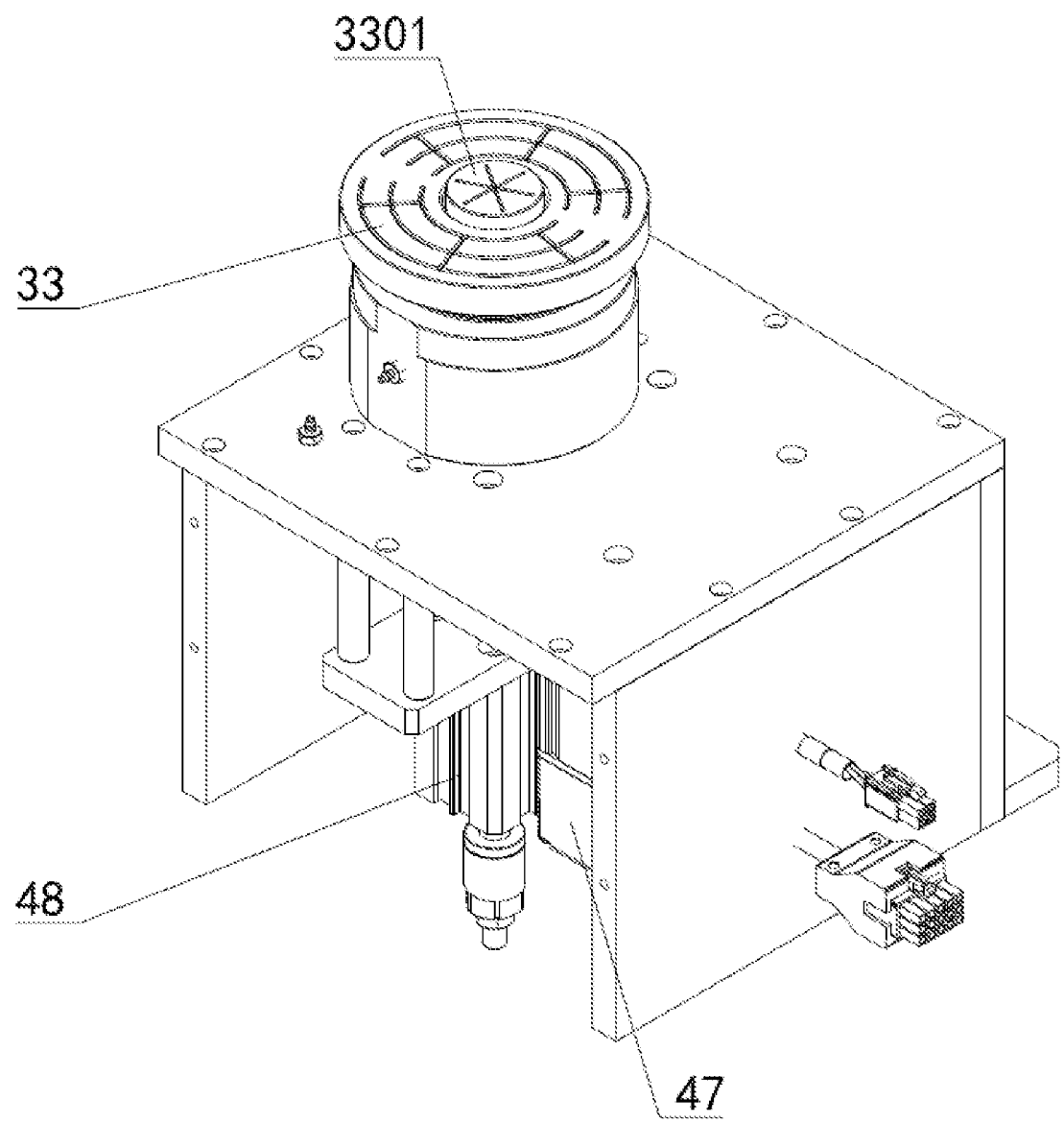

FIG. 15 is a stereoscopic view of a scraping supporting device.

Figure 16:
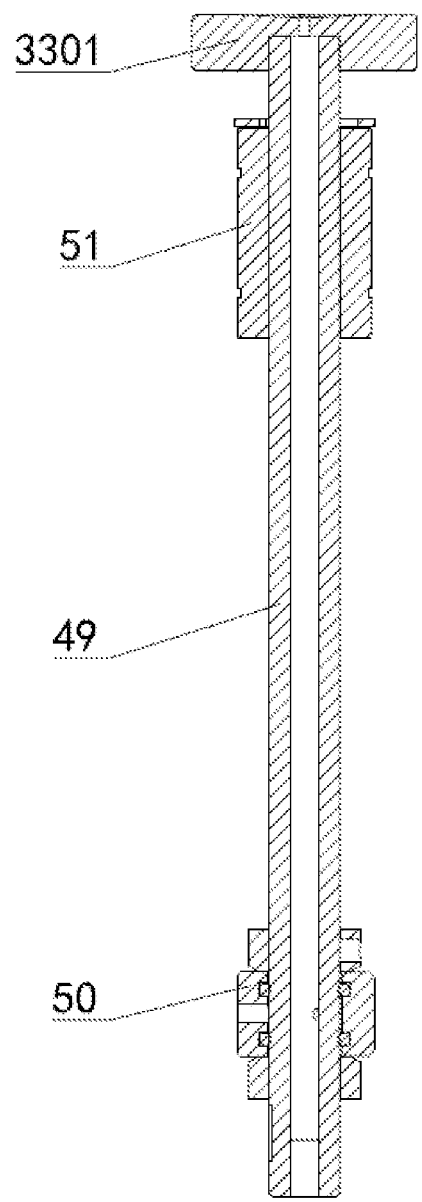

FIG. 16 is a front view of a tray connecting tube.

1. frame; 2. drying chamber; 3. feeding manipulator; 4. wafer cassette; 401. supporting trough; 5. feeding device; 6. scraping device; 7. conveyor belt; 8. discharging manipulator; 9. glass powder stirring device; 10. feeding supporting device; 11. V-shaped knife; 12. scraping supporting device; 13. wafer cassette lifting motor; 14. wafer cassette lifting frame; 15. wafer cassette supporting rod; 16. feeding translation frame; 17. manipulator translation rail; 18. feeding cylinder; 19. wafer pallet; 1901. evading port; 20. discharging translation frame; 21. discharging cylinder; 22. centering lifting cylinder; 23. centering cylinder; 24. centering die; 25. feeding gantry; 26. feeding translation cylinder; 27. fetching lifting cylinder; 28. fetching cylinder; 29. fetching tube; 2901. suction part; 30. suction rod; 31. feeding tray lifting cylinder; 32. feeding rotating motor; 33. tray; 3301. lifting part; 34. stirring cylinder; 35. glass powder trough; 36. stirring shaft; 37. stirring connecting rod; 38. stirring block; 39. scraping gantry; 40. scraping translation cylinder; 41. scraper lifting cylinder; 42. scraper holder; 4201. mounting slot; 43. scraper; 44. scraper clamp; 45. mounting pin; 46. baffle; 47. scraping rotating motor; 48. scraping tray lifting cylinder; 49. tray connecting tube; 50. connecting sleeve; 51. transmission sleeve; 52. buffer spring.

DETAILED DESCRIPTION OF THE EMBODIMENTS

Implementations of the Disclosure

FIGS. 1 to 16 are preferred embodiments of the present disclosure. The present disclosure is further described below with reference to FIGS. 1 to 16.

The present disclosure provides an apparatus for filling a wafer with glass powder. The device includes a supporting device for supporting a wafer, a feeding device 5 and a scraping device 6. The feeding device 5 and the scraping device 6 are both provided on an upper side of the supporting device. A lower side of the feeding device 5 is provided with a fetching part, and the feeding device 5 drives the fetching part to move. A lower side of the scraping device 6 is provided with a scraper 43, and the scraping device 6 drives the scraper 43 to move. After the feeding device 5 evenly applies the glass powder to the wafer through the fetching part, the scraping device 6 removes an excess of the glass powder on the wafer through the scraper 43 to ensure that an appropriate amount of glass powder on the wafer, avoiding complex subsequent processing due to excessive glass powder, and avoiding uneven glass powder distribution. The present disclosure achieves fast and stable glass powder application, which improves the yield of the electronic component and reduces the production cost.

The present disclosure is further described below with reference to the specific embodiments. Those familiar with the art should understand that the detailed description with reference to the accompanying drawings is to better explain the present disclosure, and the structure of the present disclosure inevitably goes beyond these limited embodiments. Some equivalent replacement solutions or common methods are repeated here, but they still belong to the protection scope of the present disclosure.

Specifically, as shown in FIGS. 1 and 2: the feeding device 5 is provided on an upper side of a frame 1 through a feeding gantry 25. The scraping device 6 is provided on the upper side of the frame 1 through a scraping gantry 39. The feeding gantry 25 and the scraping gantry 39 are parallel and spaced apart. The supporting device includes a feeding supporting device 10 and a scraping supporting device 12. The feeding supporting device 10 and the scraping supporting device 12 are respectively provided on the upper side of the frame 1. The feeding supporting device 10 is provided directly below the feeding device 5. The scraping supporting device 12 is provided directly below the scraping device 6. Thus, the operations of the feeding device 5 and the scraping device 6 are separated, and the feeding device 5 and the scraping device 6 are prevented from interfering with each other, thereby improving the work efficiency.

The device further includes a wafer cassette lifting device, a centering device, glass powder stirring device 9, a conveyor belt 7, a feeding manipulator 3, a discharging manipulator 8 and a drying chamber 2 provided on the frame 1. The wafer cassette lifting device and the conveyor belt 7 are symmetrically arranged on two sides of the frame 1. The feeding gantry 25 and the scraping gantry 39 are provided between the wafer cassette lifting device and the conveyor belt 7. The wafer cassette lifting device is provided close to the feeding gantry 25. The centering device is provided between the wafer cassette lifting device and the feeding gantry 25. The drying chamber 2 is covered outside the center of the conveyor belt 7. An upper side of the drying chamber 2 is provided with an air inlet tube to send hot air into the drying chamber 2, so as to dry the wafer in the drying chamber 2 by the hot air. A heating plate may further be provided in the drying chamber 2. The feeding manipulator 3 is provided on one side of the feeding gantry 25, and the discharging manipulator 8 is provided on one side of the scraping gantry 39, so as to complete the wafer transfer. The glass powder stirring device 9 is provided on one side of the feeding supporting device 10 to facilitate the feeding device 5 to transfer the glass powder in the glass powder stirring device 9 to the wafer on the feeding supporting device 10.

A lower side of an input end of the conveyor belt 7 is provided with a wafer lifting cylinder. A piston rod of the wafer lifting cylinder is provided vertically upward. A wafer carrier is provided on an upper side of the wafer lifting cylinder. The discharging manipulator 8 places the wafer on the wafer carrier, and then places the wafer on the conveyor belt 7 through the wafer lifting cylinder.

There are two wafer cassette lifting devices arranged side by side. A wafer cassette 4 is detachably provided on an upper side of each wafer cassette lifting device. The wafer is placed in the wafer cassette 4. The two wafer cassette lifting devices work alternately to achieve continuous production. The centering device is used for centering the wafer to ensure accurate glass powder feeding. The feeding manipulator 3 is used to transfer the wafer between the wafer cassette, the centering device and the feeding supporting device 10. The discharging manipulator 8 is used to transfer the wafer between the feeding supporting device 10, the scraping supporting device 12 and the conveyor belt 7. The feeding manipulator 3 and the discharging manipulator 8 work independently, which improves the work efficiency.

As shown in FIG. 3, the wafer cassette lifting device includes a wafer cassette lifting frame 14 and a wafer cassette lifting motor 13. The frame 1 is provided with a vertical wafer cassette lifting rail. The wafer cassette lifting frame 14 is slidably provided on the wafer cassette lifting rail. A plurality of wafer cassette supporting rods 15 are arranged vertically on an upper side of the wafer cassette lifting frame 14. A wafer cassette supporting plate is provided on an upper side of the wafer cassette supporting rod 15. The wafer cassette 4 is detachably provided on an upper side of the wafer cassette supporting plate. The wafer cassette lifting frame 14 is provided in a middle and lower part of the frame 1. The wafer cassette supporting rod 15 is slidably connected to the frame 1. An output shaft of the wafer cassette lifting motor 13 faces upward and is provided on a lower side of the wafer cassette lifting frame 14. A lifting screw is rotatably provided on the frame 1, and the lifting screw is provided vertically. The lifting screw is coaxially connected to the output shaft of the wafer cassette lifting motor 13 and keeps synchronous rotation. The wafer cassette lifting frame 14 is provided with a lifting nut matched with the lifting screw to realize the lifting of the wafer cassette lifting frame 14, which is convenient to control the lifting of the wafer cassette 4 and to accurately control the lifting distance of the wafer cassette 4.

As shown in FIG. 4, the wafer cassette 4 is a rectangular parallelepiped box with open front and rear sides. The distance between left and right sides of the wafer cassette 4 gradually increases from rear to front. A plurality of supporting troughs 401 are respectively provided on inner walls of two sides of the wafer cassette 4 at intervals from bottom to top. The corresponding supporting troughs 401 on the two sides of the wafer cassette 4 cooperate to support the wafer.

As shown in FIG. 5, manipulator translation rails 17 are provided on the upper side of the frame 1. The manipulator translation rails 17 are perpendicular to a plane where the feeding gantry 25 is located. There are two manipulator translation rails 17 that are horizontally arranged. The feeding manipulator 3 and the discharging manipulator 8 are respectively slidably provided on the manipulator translation rails 17.

The feeding manipulator 3 includes a feeding translation frame 16, a feeding cylinder 18 and a wafer pallet 19. The feeding translation frame 16 is slidably mounted on the manipulator translation rail 17. The feeding translation frame 16 is connected to a feeding linear motor. The feeding linear motor is provided on a lower side of the feeding translation frame 16. The feeding linear motor is connected to the feeding translation frame 16 and drives the feeding translation frame to translate. The feeding cylinder 18 is provided on an upper side of the feeding translation frame 16. A piston rod of the feeding cylinder 18 is provided toward one side of the wafer cassette 4. The piston rod of the feeding cylinder 18 is perpendicular to the manipulator translation rail 17. The wafer pallet 19 is provided on the piston rod of the feeding cylinder 18 to realize the picking and placing of the wafer.

The discharging manipulator 8 includes a discharging translation frame 20, a discharging cylinder 21 and a wafer pallet 19. The discharging translation frame 20 is slidably provided on the manipulator translation rail 17. The discharging translation frame 20 is connected to a discharging linear motor. The discharging linear motor is provided on a lower side of the discharging translation frame 20. The discharging linear motor is connected to the discharging translation frame 20 and drives the discharging translation frame to translate. The discharging cylinder 21 is provided on an upper side of the discharging translation frame 20. A piston rod of the discharging cylinder 21 is provided toward one side of the conveyor belt 7. The piston rod of the discharging cylinder 21 is perpendicular to the manipulator translation rail 17. The wafer pallet 19 is provided on the piston rod of the discharging cylinder 21 to realize the picking and placing of the wafer. The discharging translation frame 20 is provided on one side of the feeding translation frame 16 close to the conveyor belt 7.

The wafer pallet 19 is round. One side of the wafer pallet 19 is provided with a connecting part for connecting the piston rod of the feeding cylinder 18 or the piston rod of the discharging cylinder 21. A suction hole is provided on an upper side of the wafer pallet 19. The suction hole is connected to a vacuum device to suck the wafer and prevent the wafer from being separated from the wafer pallet 19. The vacuum device is a vacuum pump. A side of the wafer pallet 19 away from the manipulator translation rail 17 is provided with an evading port 1901 concave in the center, which is convenient to push the wafer away from the wafer pallet 19 and is also convenient for the wafer pallet 19 to suck the wafer.

As shown in FIG. 6, the centering device includes a centering lifting cylinder 22, a centering cylinder 23 and a centering die 24. The centering lifting cylinder 22 is provided on the frame 1. A piston rod of the centering lifting cylinder 22 is vertically provided upward. The centering cylinder 23 is mounted on the piston rod of the centering lifting cylinder 22. The centering cylinder 23 is provided vertically. The centering die 24 is mounted on the centering cylinder 23. The centering die 24 includes two centering plates arranged side by side. The adjacent sides of the two centering plates are respectively provided with an arc-shaped part concave in the center. The centering cylinder 23 is connected to the centering plates on the two sides and drives the two centering plates to move in opposite directions synchronously so as to center the wafer, thereby facilitating subsequent wafer processing. The centering cylinder 23 may be realized by using two cylinders. The two cylinders are respectively connected to the centering plate on the corresponding side and drive the centering plate to translate.

As shown in FIGS. 7 and 8, the feeding device 5 includes a feeding translation device and a feeding lifting device. The feeding translation device is provided on the feeding gantry 25. The feeding lifting device is slidably provided on the feeding gantry 25. The feeding translation device is connected to the feeding lifting device to drive the feeding lifting device to translate along the feeding gantry 25. A lower side of the feeding lifting device is provided with a fetching part.

The feeding lifting device includes a fetching lifting cylinder 27 and a feeding translation frame. An upper side of the feeding gantry 25 is provided with a feeding translation rail. The feeding translation rail is perpendicular to the manipulator translation rail 17 and is provided horizontally. The feeding translation frame is slidably provided on the feeding translation rail. The feeding translation device is a feeding translation cylinder 26. The feeding translation cylinder 26 is parallel to the feeding translation rail. A piston rod of the feeding translation cylinder 26 is connected to the feeding translation frame and drives the feeding translation frame to translate. A piston rod of the fetching lifting cylinder 27 is vertically provided downward. A fetching frame is provided on the piston rod of the fetching lifting cylinder 27. The fetching part is provided on the fetching frame to transfer the glass powder in the glass powder stirring device 9 to the wafer on the upper side of the feeding supporting device 10.

The fetching part includes a fetching cylinder 28, a fetching tube 29 and a suction rod 30. The fetching cylinder 28 is provided on the fetching frame and moves vertically synchronously with the fetching frame. A piston rod of the fetching cylinder 28 is provided downward. The fetching tube 29 is vertically provided on the fetching frame. A lower end of the suction rod 30 slides into the fetching tube 29. The suction rod 30 is in a sealed connection with an inner wall of the fetching tube 29. An upper end of the suction rod 30 is connected to the piston rod of the fetching cylinder 28 and moves synchronously with the piston rod, such that the fetching tube 29 and the suction rod 30 cooperate to suck the glass powder, thereby facilitating the transfer of the glass powder to the wafer. An outer diameter of a lower end of the fetching tube 29 is smaller than an outer diameter of a central part of the fetching tube, such that a suction part 2901 is formed at the lower end of the fetching tube 29 to facilitate the suction of the glass powder and the accurate transfer of the glass powder to a designated position of the wafer.

As shown in FIGS. 9 and 10, the glass powder stirring device 9 includes a stirring cylinder 34, glass powder trough 35 and a stirring block 38. The glass powder trough 35 is semi-cylindrical with a concave central part. The glass powder trough 35 is provided horizontally. A stirring shaft 36 is provided on an upper side of the glass powder trough 35. The stirring shaft 36 is coaxially provided with the glass powder trough 35 and is rotatably connected to the glass powder trough 35. A piston rod of the stirring cylinder 34 is connected to the stirring shaft 36 and drives the stirring shaft 36 to reciprocate. Two ends of the stirring shaft 36 are symmetrically provided with stirring connecting rods 37. The stirring connecting rod 37 is provided in the glass powder trough 35. One end of the stirring connecting rod 37 is connected to the stirring shaft 36 and swings synchronously with the rotation of the stirring shaft 36. The stirring block 38 is provided at the bottom of the glass powder trough 35. The stirring block 38 is provided between the two stirring connecting rods 37. Two sides of the stirring block 38 are respectively fixedly connected to the stirring connecting rod 37 on the corresponding side, such that the glass powder is stirred by the stirring block 38. Since the glass powder is insoluble in water, the stirring block 38 always stirs the glass powder to prevent the glass powder from sinking to the bottom of the water to result in uneven mixing of the glass powder and the water.

One side of the stirring block 38 is provided with a fetching port concave in the center. When the stirring block 38 swings to approach a side of the feeding supporting device 10, the fetching port of the stirring block 38 is exactly facing upwards, which facilitates the fetching of the fetching tube 29 and the control of the amount of the glass powder.

The feeding supporting device 10 includes a feeding tray lifting cylinder 31, a feeding rotating motor 32 and a tray 33. A piston rod of the feeding tray lifting cylinder 31 is vertically provided upward on the frame 1. The feeding rotating motor 32 is provided on the frame 1 on one side of the feeding tray lifting cylinder 31. A blocking barrel is provided on the upper side of the frame 1. The blocking barrel is vertical. An upper end of the blocking barrel is open. The diameter of the blocking barrel is larger than that of the tray 33. The tray 33 is rotatable in the blocking barrel. The feeding tray lifting cylinder 31 is provided directly below the tray 33. A piston rod of the feeding tray lifting cylinder 31 is connected to the tray 33 through a tray connecting tube 49 and drives the tray 33 to lift. The tray connecting tube 49 is rotatably connected to the piston rod of the feeding tray lifting cylinder 31. The feeding rotating motor 32 is connected to the tray connecting tube 49 through a synchronous belt, thereby realizing the rotation of the tray 33, such that the glass powder is evenly distributed on the entire wafer through a centrifugal force. The blocking barrel can block the glass powder.

The tray 33 includes an annular fixed part and a lifting part 3301 provided coaxially with the fixing part. The lifting part 3301 is provided in the fixed part. The lifting part and the fixed part enclose to form a complete disc. The piston rod of the feeding tray lifting cylinder 31 is connected to the lifting part 3301 and drives the lifting part to lift, so as to cooperate with the wafer pallet 19 to realize the feeding and discharging of the wafer. A suction trough is provided on an upper side of the tray 33. The suction trough is provided on the upper side of the tray 33, and the suction trough is connected to a vacuum device to suck the wafer firmly and also to ensure the flatness of the wafer. The vacuum device is a vacuum pump.

As shown in FIG. 11, the scraping device 6 includes a scraping translation cylinder 40, a scraper lifting cylinder 41, a scraping translation frame and a scraping lifting frame. An upper side of the scraping gantry 39 is provided with a scraping translation rail. The scraping translation rail is parallel to the feeding translation rail. The scraping translation frame is slidable on the scraping translation rail. The scraping translation cylinder 40 is provided on the scraping gantry 39. A piston rod of the scraping translation cylinder 40 is connected to the scraping translation frame and drives the scraping translation frame to translate. The scraper lifting cylinder 41 is vertically provided on the scraping translation frame. A piston rod of the scraper lifting cylinder 41 is provided downward. The scraping lifting frame is provided on the scraper lifting cylinder 41 and moves vertically synchronously with the scraper lifting cylinder 41. A scraper 43 is provided on a lower side of the scraping lifting frame, so as to scrape off an excess of the glass powder on the wafer.

As shown in FIGS. 12 and 13, the scraper 43 is mounted on a scraper clamp 44. The scraper clamp 44 is provided on the scraping lifting frame through the scraper holder 42. The scraper 43 is perpendicular to the scraping translation rail. The scraper holder 42 is a rectangular parallelepiped box with an open lower side. An upper side of the scraper clamp 44 extends into the scraper holder 42 and is slidably connected to the scraper holder 42. The mounting pins 45 are symmetrically provided with at two ends of the scraper clamp 44. Two sides of the scraper holder 42 are respectively provided with mounting slots 4201 matched with the mounting pins 45 on the corresponding sides. The mounting slot 4201 is vertically provided to guide the lifting of the scraper clamp 44. A buffer spring 52 is provided between the scraper clamp 44 and the scraper holder 42. The buffer spring 52 is in a compressed state, and the buffer spring 52 is provided in the scraper holder 42 to ensure that a stable pressure of the scraper 43 on the wafer, so as to avoid damage to the wafer.

Two sides of the scraper clamp 44 are both spaced apart from a corresponding side of the scraper holder 42. A baffle 46 is provided between one side of the scraper clamp 44 and the scraper holder 42. The baffle 46 is fixedly connected to the scraper holder 42. An upper part of a side of the scraper clamp 44 close to the baffle 46 is arc-shaped, convex in the center. Therefore, when scraping the glass powder, the scraper 43 is at an acute angle with the wafer, ensuring reliable scraping of the glass powder and avoiding damage to the wafer. A lower end of one side of the scraper holder 42 where the baffle 46 is provided is lower than the other side, so as to avoid hindering the swing of the scraper 43.

As shown in FIG. 14, a V-shaped knife 11 is provided on one side of the scraping gantry 39. The opening of the V-shaped knife 11 faces upward. The V-shaped knife is perpendicular to the scraper 43. The V-shaped knife 11 is provided on a side of the scraper 43 close to the baffle 46. When the scraper 43 finishes scraping the glass powder, there is glass powder attached to scraper 43. Then the scraping device 6 drives the scraper 43 to adhere to the V-shaped knife 11 and drives the scraper 43 to rise, such that the glass powder on the scraper 43 is scraped off by the V-shaped knife 11. The scraped glass powder gathers in the center of the V-shaped knife 11, which facilitates the collection of the scraped glass powder and can realize the recycling of the excess glass powder, thereby saving the raw material and reducing the production cost.

As shown in FIG. 15, the scraping supporting device 12 includes a scraping tray lifting cylinder 48, a scraping rotating motor 47 and a tray 33. A piston rod of the scraping tray lifting cylinder 48 is vertically provided upward on the frame 1. The scraping rotating motor 47 is provided on the frame 1 on one side of the scraping tray lifting cylinder 48. The scraping tray lifting cylinder 48 is provided directly below the tray 33. A piston rod of the scraping tray lifting cylinder 48 is connected to the tray 33 through a tray connecting tube 49 and drives the tray 33 to lift. The tray connecting tube 49 is rotatably connected to the piston rod of the scraping tray lifting cylinder 48. The scraping rotating motor 47 is connected to the tray connecting tube 49 through a synchronous belt, thereby realizing the rotation of the tray 33. The scraping tray lifting cylinder 48 drives the lifting part 3301 of the tray 33 to lift so as to cooperate with the wafer pallet 19 to pick and place the wafer. The scraping gantry 39 is provided with a sensor for detecting the position of the wafer. The sensor detects the relative positions of a trough on the wafer and the scraper 43. The scraping rotating motor 47 drives the wafer to rotate, such that the trough of the wafer and the scraper 43 are at an angle of 45° to avoid that the scraper 43 extends into the trough of the wafer to cause insufficient glass powder filling and affect the yield of the electronic component.

As shown in FIG. 16, an upper end of the tray connecting tube 49 is connected to the lifting part 3301. The tray connecting tube 49 communicates with the suction trough of the lifting part 3301. A lower end of the tray connecting tube 49 is closed. A connecting sleeve 50 is sleeved on a lower part of the tray connecting tube 49. An inner wall of the connecting sleeve 50 is spaced apart from an outer wall of the tray connecting tube 49. Sealing rings are respectively provided between upper and lower ends of the connecting sleeve 50 and the tray connecting tube 49, such that a negative-pressure cavity is formed between the connecting sleeve 50 and the tray connecting tube 49. The tray connecting tube 49 is provided with a through hole communicating with the negative-pressure cavity. The connecting sleeve 50 is provided with a connecting hole communicating with the negative-pressure cavity, thereby facilitating communication with the vacuum device. The connecting sleeve 50 is rotatably connected to the tray connecting tube 49. The upper and lower sides of the connecting sleeve 50 are provided with limit sleeves for limiting the connecting sleeve 50, so as to avoid relative displacement between the connecting sleeve 50 and the tray connecting tube 49 and ensure reliable sealing between the connecting sleeve 50 and the tray connecting tube 49.

A transmission sleeve 51 is sleeved on an outer part of the tray connecting tube 49. The transmission sleeve 51 is coaxially connected to the tray connecting tube 49 and keeps synchronous rotation. The transmission sleeve 51 is used to mount the synchronous pulley. The transmission sleeve 51 and the tray connecting tube 49 are axially slidable.

The above described are merely preferred embodiments of the present disclosure, which are not intended to limit the present disclosure in other forms. Any person skilled in the art may change or modify the technical content disclosed above into an equivalent. Any simple amendments or equivalent changes and modifications made to the above embodiments according to the technical essence of the present disclosure without departing from the content of the technical solution of the present disclosure should fall within the protection scope of the technical solution of the present disclosure.

What is claimed is:

1. An apparatus for filling a wafer with glass powder, comprising
    a supporting device for supporting the wafer,
    a feeding device, and
    a scraping device, wherein
        the feeding device and the scraping device are both provided on an upper side of the supporting device;
        a lower side of the feeding device is provided with a fetching part, and the feeding device drives the fetching part to move; and
        a lower side of the scraping device is provided with a scraper, and the scraping device drives the scraper to move, wherein
    the fetching part comprises a fetching tube, a suction rod and a fetching cylinder;
        one end of the suction rod extends into the fetching tube;
        the suction rod and the fetching tube are slidably and hermetically connected;
        the fetching tube is mounted on the feeding device;
        the fetching cylinder is mounted on the feeding device; and
        the fetching cylinder is connected to the suction rod and the fetching cylinder drives the suction rod to move axially.

2. The apparatus according to claim 1, wherein
    the fetching tube is provided vertically;
    an outer diameter of a lower end of the fetching tube is smaller than an outer diameter of a central part of the fetching tube, and
    a suction part is formed at the lower end of the fetching tube.

3. The apparatus according to claim 1, wherein
    the feeding device comprises a feeding translation device and a feeding lifting device; wherein
        the feeding lifting device is mounted on the feeding translation device; and
        the fetching part is provided on the feeding lifting device.

4. The apparatus according to claim 1, wherein
    the supporting device comprises a feeding supporting device and a scraping supporting device;
        the feeding device is provided on an upper side of the feeding supporting device; and
        the scraping device is provided on a lower side of the scraping supporting device.

5. The apparatus according to claim 4, wherein
    the feeding supporting device comprises a tray and a feeding rotating motor; wherein
        the tray is provided horizontally;
        the feeding rotating motor is connected to the tray and the feeding rotating motor drives the tray to rotate;
        an upper side of the tray is provided with a plurality of suction troughs; and
    the plurality of suction troughs are connected to a vacuum device.

6. An apparatus for filling a wafer with glass powder, comprising
    a supporting device for supporting the wafer,
    a feeding device, and
    a scraping device, wherein
        the feeding device and the scraping device are both provided on an upper side of the supporting device;
        a lower side of the feeding device is provided with a fetching part, and the feeding device drives the fetching part to move; and
        a lower side of the scraping device is provided with a scraper, and the scraping device drives the scraper to move, wherein
    the scraper is mounted on the scraping device through a scraper holder;
    an upper part of the scraper is slidably connected to the scraper holder; and
    a buffer spring is provided between the scraper and the scraper holder.

7. The apparatus according to claim 6, wherein
    a scraper clamp is fixed on an upper side of the scraper;
    mounting pins are symmetrically provided at two ends of the scraper clamp;
    two sides of the scraper holder are respectively provided with mounting slots matched with the mounting pins on corresponding sides;
    an upper part of the scraper clamp is slidably provided in the scraper holder; and
    the buffer spring is provided between the scraper clamp and the scraper holder.

8. The apparatus according to claim 7, wherein
    two sides of the scraper clamp are both spaced apart from the scraper holder.

9. An apparatus for filling a wafer with glass powder, comprising
    a supporting device for supporting the wafer,
    a feeding device, and
    a scraping device, wherein
        the feeding device and the scraping device are both provided on an upper side of the supporting device;
        a lower side of the feeding device is provided with a fetching part, and the feeding device drives the fetching part to move; and
        a lower side of the scraping device is provided with a scraper, and the scraping device drives the scraper to move, wherein
    one side of the scraper is provided with a V-shaped knife;
    an opening of the V-shaped knife faces upward; and
    the V-shaped knife is perpendicular to the scraper.

* * * * *